(12) United States Patent
Hsieh et al.

(10) Patent No.: US 9,736,566 B2
(45) Date of Patent: Aug. 15, 2017

(54) EARPHONE LINE CONTROL DEVICE AND EARPHONE

(71) Applicant: 1MORE INC., Shenzhen (CN)

(72) Inventors: Kuanhong Hsieh, Shenzhen (CN); Boqing Lin, Shenzhen (CN); Xiaohong Sun, Shenzhen (CN)

(73) Assignee: 1More, Inc., Shenzhen (CN)

( * ) Notice: Subject to any disclaimer, the term of this patent is extended or adjusted under 35 U.S.C. 154(b) by 0 days.

(21) Appl. No.: 14/425,306

(22) PCT Filed: Nov. 21, 2014

(86) PCT No.: PCT/CN2014/091913
§ 371 (c)(1),
(2) Date: Jun. 13, 2016

(87) PCT Pub. No.: WO2015/074607
PCT Pub. Date: May 28, 2015

(65) Prior Publication Data
US 2016/0277826 A1    Sep. 22, 2016

(30) Foreign Application Priority Data

Nov. 22, 2013 (CN) .......................... 2013 1 0594749

(51) Int. Cl.
*H04R 1/10* (2006.01)
*H04R 3/04* (2006.01)
(Continued)

(52) U.S. Cl.
CPC ............ *H04R 1/1041* (2013.01); *H04R 1/10* (2013.01); *H04R 1/1033* (2013.01); *H04R 3/00* (2013.01);
(Continued)

(58) Field of Classification Search
CPC .......... H04M 1/72; H04M 1/60; H04M 1/725; G11B 19/02; H04R 1/10; H04R 2201/107;
(Continued)

(56) References Cited

U.S. PATENT DOCUMENTS 7,683,974 B2 * 3/2010 Sun ........................ H01R 27/02
348/705
8,204,268 B2 * 6/2012 Li ........................ H04R 1/1041
381/379
(Continued)

FOREIGN PATENT DOCUMENTS

CN    101102337 A  *  1/2008
CN    101493728 A  *  7/2009
(Continued)

*Primary Examiner* — Davetta W Goins
*Assistant Examiner* — Kuassi Ganmavo
(74) *Attorney, Agent, or Firm* — Lewis Kohn & Walker LLP; David M. Kohn; Kari Moyer-Henry

(57) ABSTRACT

An earphone line control device includes a power supply management unit, a filter unit, a switching circuit and a control unit. The switching circuit includes a switch in series with a resistance, a first end of the power supply management unit and an end of the filter unit are both connected to a power supply, a second end of the power supply management unit is connected to a first end of the control unit, the other end of the filter unit is connected to a second end of the control unit, a third end of the power supply management unit is connected to ground, a third end of the control unit is connected to ground, an end of the resistance is connected to the power supply, the other end of the resistance is in series with an end of the switch and connected to a fifth end of the control unit, and the other end of the switch is connected to a forth end of the control unit. When the switch is turned off, the control unit outputs a preset coded pulse signal.

12 Claims, 8 Drawing Sheets

(51) Int. Cl.
*H04R 5/04* (2006.01)
*H04R 3/00* (2006.01)
*G06F 1/32* (2006.01)
*H03G 3/00* (2006.01)
*G06F 1/30* (2006.01)
*H04M 1/72* (2006.01)
*H04M 1/725* (2006.01)
*H04M 1/60* (2006.01)

(52) U.S. Cl.
CPC ............ *H04R 3/04* (2013.01); *H04R 5/04* (2013.01); *G06F 1/305* (2013.01); *G06F 1/3203* (2013.01); *H03G 3/002* (2013.01); *H03G 3/007* (2013.01); *H04M 1/60* (2013.01); *H04M 1/72* (2013.01); *H04M 1/725* (2013.01); *H04R 2420/07* (2013.01)

(58) Field of Classification Search
CPC ...... H04R 1/1041; H04R 1/1033; H04R 3/00; H04R 3/04; H04R 5/04; H04R 2420/07; H03G 3/007; H03G 3/002; G06F 1/305; G06F 1/3203
See application file for complete search history.

(56) References Cited

U.S. PATENT DOCUMENTS

| | | | |
|---|---|---|---|
| 2009/0179789 A1* | 7/2009 | Haughay, Jr. ........... | H04M 1/05 341/176 |
| 2016/0080854 A1* | 3/2016 | Chen ....................... | H04R 3/00 381/74 |
| 2016/0094907 A1* | 3/2016 | Xiao ..................... | H04R 1/1041 381/74 |

FOREIGN PATENT DOCUMENTS

| | | | |
|---|---|---|---|
| CN | 201360281 Y | * | 12/2009 |
| CN | 202435574 U | * | 9/2012 |
| CN | 202565454 U | * | 11/2012 |

* cited by examiner

EARPHONE LINE CONTROL DEVICE AND EARPHONE

FIELD OF THE INVENTION

The invention relates to a field of earphone, and more particularly relates to an earphone line control device and an earphone.

BACKGROUND OF THE INVENTION

Due to the development of terminal technique, more and more terminal devices appear nowadays. In order to provide the terminal device with an enhanced processing ability and more functions, operating systems for terminal devices are developed. Currently, there are a variety of operating systems, of which the most widely used systems are Android, iOS, Symbian, Windows Phone, and BlackBerry OS.

Mobile phones with different operating systems require different earphones, which cause an earphone fail to be applied to different mobile phones. For example, an earphone provided for an Android mobile phone cannot be applied to an mobile phone with iOS operation system, and vice versa.

SUMMARY OF THE INVENTION

Accordingly, it is necessary to provide an earphone line control device and an earphone to enable the earphone to be generally applied to terminal devices of different operating systems.

An earphone line control device includes a power supply management unit, a filter unit, a switching circuit and a control unit. The switching circuit includes a switch in series with a resistance, a first end of the power supply management unit and an end of the filter unit are both connected to a power supply, a second end of the power supply management unit is connected to a first end of the control unit, the other end of the filter unit is connected to a second end of the control unit, a third end of the power supply management unit is connected to ground, a third end of the control unit is connected to ground, an end of the resistance is connected to the power supply, the other end of the resistance is in series with an end of the switch and connected to a fifth end of the control unit, and the other end of the switch is connected to a forth end of the control unit. When the switch is turned off, the control unit outputs a preset coded pulse signal.

In an embodiment, the line control device further includes a custom switch circuit, when the switch in the custom switch circuit is turned off, the control unit outputs a preset coded audio signal.

In an embodiment, when the switches in different switch circuits are turned off, the control unit respectively outputs different preset coded audio signals.

In an embodiment, the power supply management unit includes a diode, a second resistance and a power supply capacitance; an anode of the diode, an end of the second resistance, and an end of the power supply capacitance are all connected to the power supply, a cathode of the diode and the other end of the second resistance are both connected to the first end of the control unit, and the other end of the power supply capacitance is connected to ground.

An earphone line control device includes a power supply management unit, a filter unit, a switching circuit and a control unit. The switching circuit includes a switch and a resistance, a first end of the power supply management unit and an end of the filter unit are both connected to a power supply, a second end of the power supply management unit is connected to a first end of the control unit, the other end of the filter unit is connected to a second end of the control unit, a third end of the power supply management unit is connected to ground, a third end of the control unit is connected to ground, an end of the resistance is connected to the power supply, the other end of the resistance is connected to a sixth end of the control unit, an end of the switch is connected to a seventh end of the control unit, and the other end of the switch is connected to ground. When the switch is turned off, the control unit outputs a preset coded pulse signal.

In an embodiment, the line control device further includes a custom switch circuit, when the switch in the custom switch circuit is turned off, the control unit outputs a preset coded audio signal.

In an embodiment, when the switches in different switch circuits are turned off, the control unit respectively outputs different preset coded audio signals.

In an embodiment, the power supply management unit includes a diode, a second resistance and a power supply capacitance; an anode of the diode, an end of the second resistance and an end of the power supply capacitance are all connected to the power supply, a cathode of the diode and the other end of the second resistance are both connected to the first end of the control unit, and the other end of the capacitance is connected to ground.

An earphone includes the earphone line control device according to anyone of the prior embodiments.

The earphone line control device and the earphone can enable the earphone to be generally applied to terminal devices of at least two different operating systems.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION OF THE EMBODIMENTS

Figure 1:
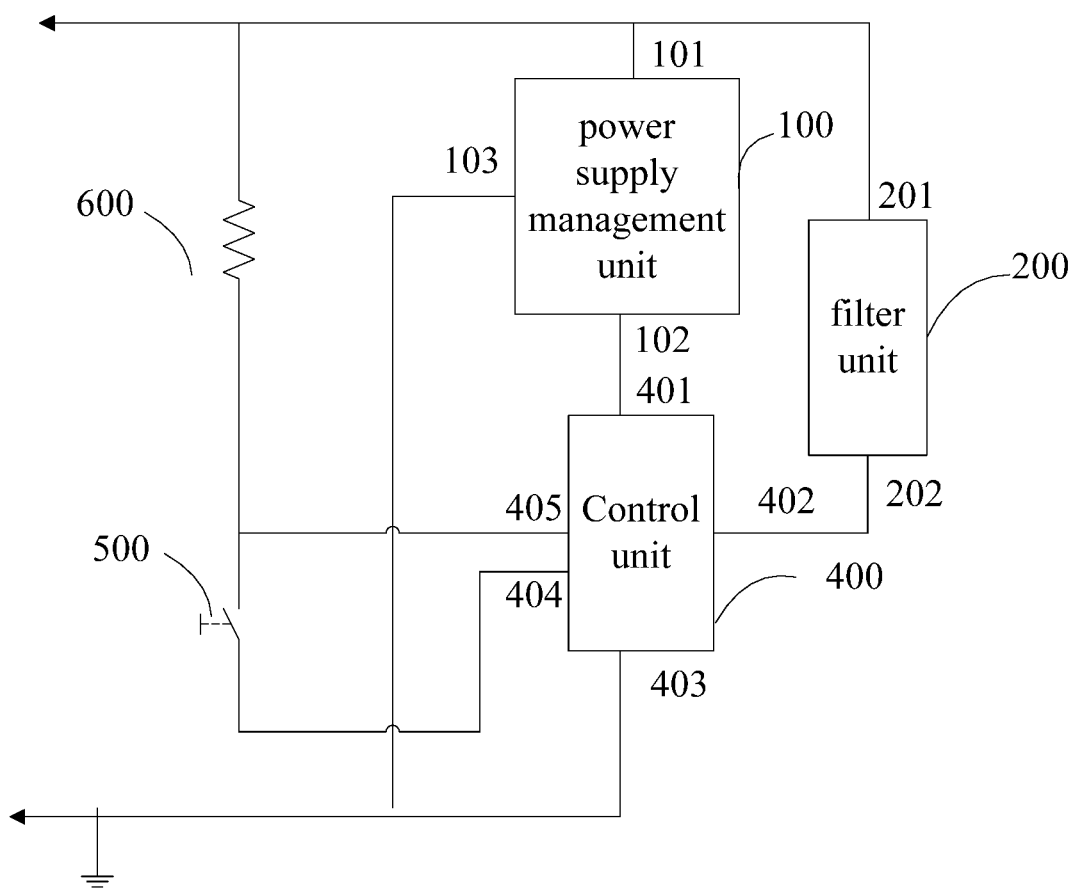
FIG. 1 is a block diagram of an earphone line control device in accordance with an embodiment.

Embodiments of the invention are described more fully hereinafter with reference to the accompanying drawings.

The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art. Elements that are identified using the same or similar reference characters refer to the same or similar elements.

The present disclosure provides an earphone including a sound cavity, an earphone line control device, and a data line interconnecting the sound cavity and the earphone line control device. The earphone can be a wired earphone or a Bluetooth earphone. For the wired earphone, the earphone further includes a plug.

Referring to FIG. 1, in an embodiment, the earphone line control device includes a power supply management unit 100, a filter unit 200, a switching circuit including a switch 500 in series with a resistance 600, and a control unit 400. A first end 101 of the power supply management unit 100, an end 201 of the filter unit 200, and an end of the resistance 600 are respectively connected to a power supply, a second end 102 of the power supply management unit is connected to a first end 401 of the control unit 400, the other end 202 of the filter unit 200 is connected to a second end 402 of the control unit 400, a third end 103 of the power supply management unit 100 is connected to ground, a third end 403 of the control unit 400 is connected to ground, the other end of the resistance 600 is in series with an end of the switch 500 and connected to a fifth end of the control unit, and the other end of the switch 500 is connected to a forth end 404 of the control unit 400. When the switch 500 is turned off, the control unit 400 outputs a preset coded pulse signal.

The forth end 404 of the control unit 400 is set to low level, when the switch 500 is turned on, a lower end of the resistance 600 is at low level. When the control unit 400 detects the low level, the control unit 400 outputs nothing, the mobile phone connected with the earphone automatically identifies the voltage value of an upper end of the resistance, and an earphone function of operation system A is implemented. When the switch 500 is turned off, the lower end of the resistance 600 is at high level. After the control unit 400 detects the high level, the control unit 400 outputs a preset coded pulse signal, the mobile phone connected to the earphone receives the preset coded pulse signal, and then executes a corresponding operation, such as providing an earphone function of operation system B.

Figure 2:
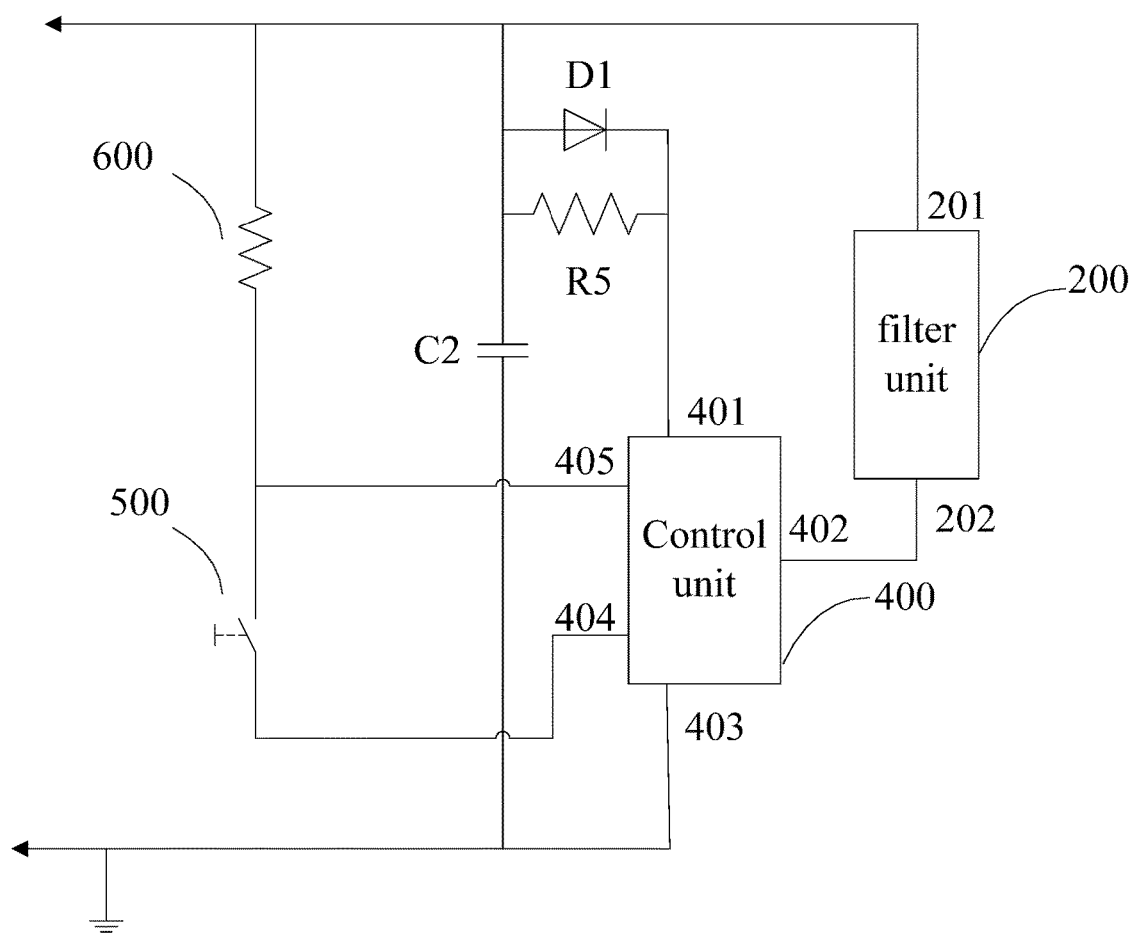
FIG. 2 is a block diagram of an earphone line control device in accordance with another embodiment.

FIG. 2 shows another embodiment of the disclosure, in the embodiment, the power supply management unit 100 includes a diode D1, a second resistance R5 and a power supply capacitance C2. An anode of the diode D1, an end of the second resistance R5, and an end of the power supply capacitance C2 are all connected to the power supply, a cathode of the diode D1 and the other end of the second resistance R5 are both connected to the first end 401 of the control unit 400, and the other end of the power supply capacitance C2 is connected to ground.

The power supply management unit 100 is configured to provide stable power for the control unit 400. The power supply capacitance C2 has functions of stabilizing the voltage, following current and power supplying for the control unit 400. Without the diode D1, the voltage may be too low and the power supply capacitance C2 will electro-discharge too fast, causing the control unit 300 to be crashed, and fail to work normally. The second resistance R5 is configured to boost the voltage of the power supply capacitance C2 to the output voltage value of the earphone plug of the mobile phone.

Figure 3:
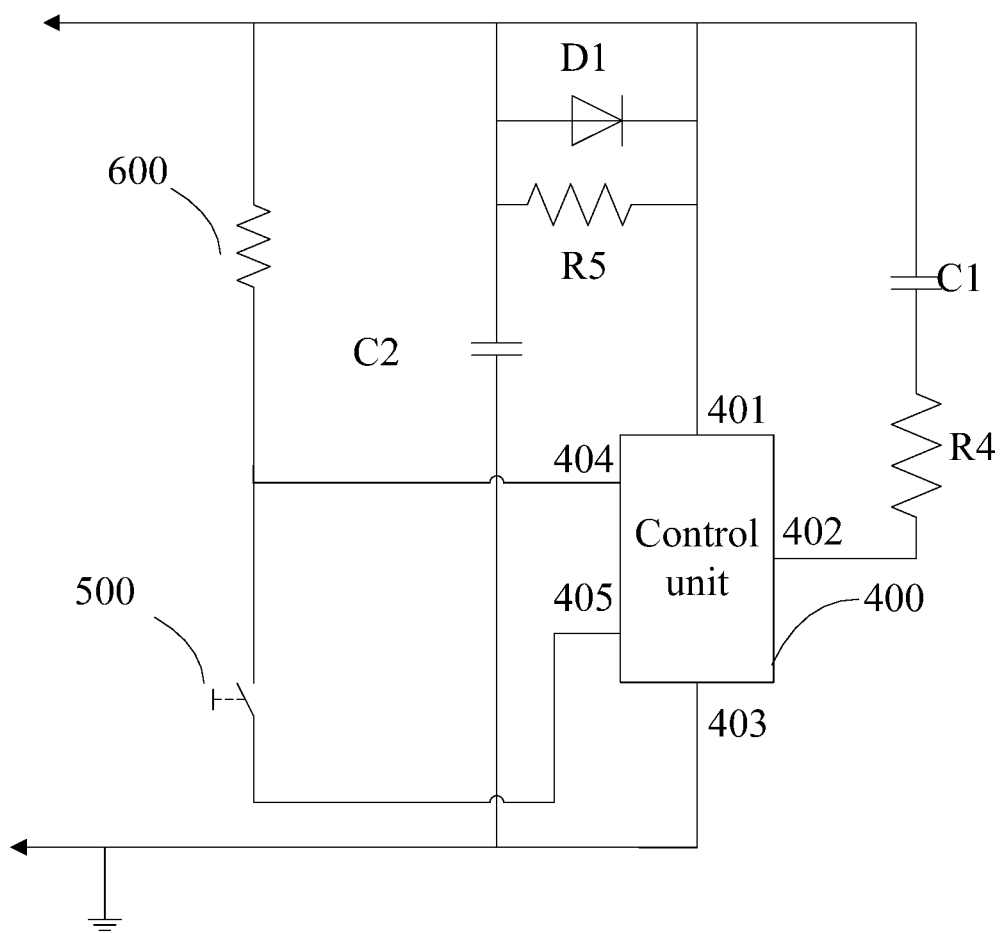
FIG. 3 is a block diagram of an earphone line control device in accordance with another embodiment.

FIG. 3 shows another embodiment of the disclosure, in the embodiment, the filter unit 200 consists of a resistance R4 connecting in series with a capacitance C1.

Figure 4:
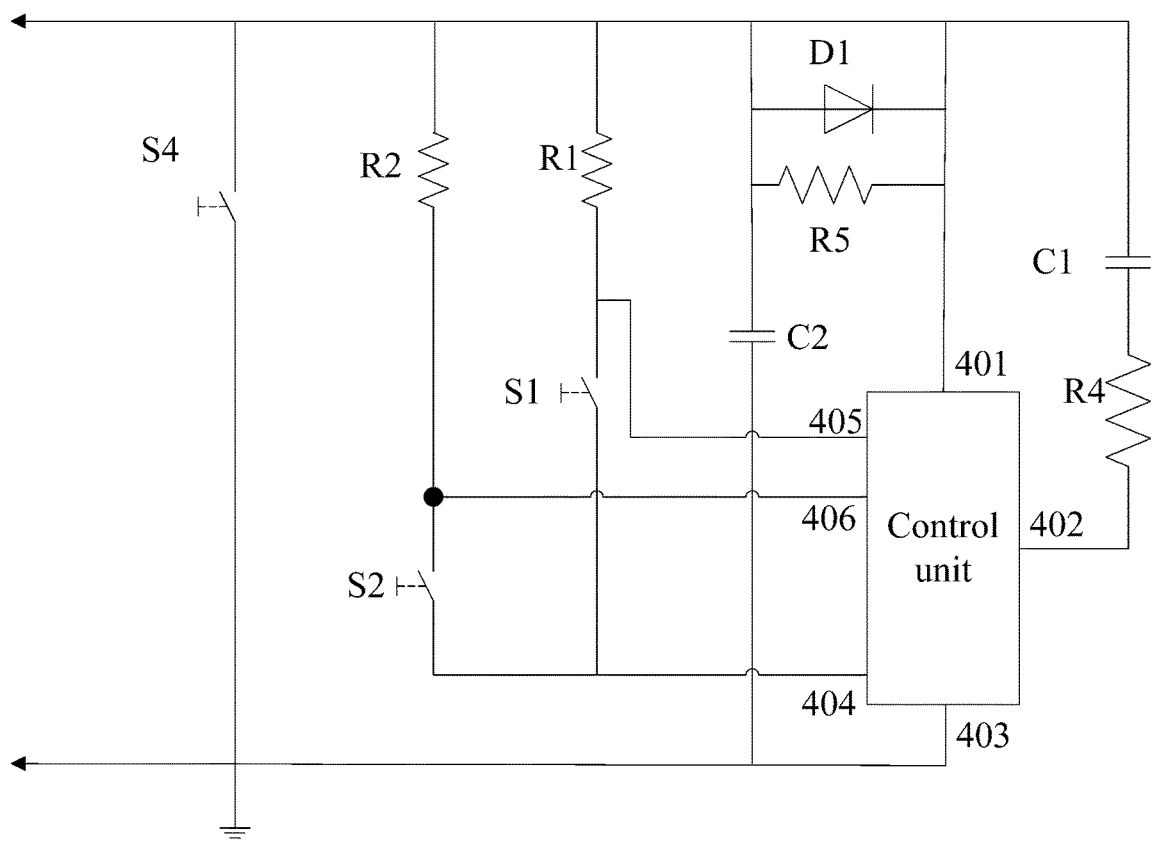
FIG. 4 is a block diagram of an earphone line control device in accordance with another embodiment.

FIG. 4 shows another embodiment of the disclosure, wherein the earphone line control device has two switching circuits, one switching circuit includes a resistance R1 and a switch S1, and the other switching circuit includes a resistance R2 and a switch S2. The switch S1 is a VOL DOWN (−) switch of the earphone line control device, and the switch S2 is a VOL UP (+) switch of the earphone line control device. A switch S4 is a PLAY/PAUSE switch, the control unit 400 detects if the switch S1 or the switch S2 is turned off.

When the switch S1 or the switch S2 is turned on, the resistance R1 or the resistance R2 divides voltage with an internal circuit of the mobile phone, and thus forms different voltage values, the mobile phone distinguishes whether the switch S1 or the switch S2 is turned on according to the voltage values, so as to implement functions of volume regulating or previous song / next song on an earphone of a kind of operation system (such as Android).

If the switch S1 or the switch S2 remains being turned on, the electric quantity of the power supply capacitance C2 will keep consuming. After the switch S1 or switch S2 has been turned on for a time period over a limit value, the electric quantity of the power supply capacitance C2 will be exhausted, thereby causing the control unit 400 to be crashed. Following schemes can be employed to avoid this problem:

When the control unit 400 supplies power normally, the forth end 404 of the control unit 400 is set to low level. When the switch S1 or the switch S2 is turned on, the fifth end 405 of the control unit corresponding to the switch S1 and the sixth end 406 the control unit corresponding to the switch S2 are at low level, at this moment, the control unit 400 will start counting. If the switch S1 or the switch S2 is still turned on within a set time, the forth end 404 of the control unit 400 will be set to high level, then the fifth end 405 and the sixth end 406 will change from low level to high level, and the control unit 400 will output a coded pulse signal via the second end 402.

If the switch S1 or the switch S2 is turned off within the set time, the fifth end 405 and the sixth end 406 of the control unit 400 will change from low level to high level, and the control unit 400 will output a coded pulse signal via the second end 402.

When the switch S1 is turned off, the control unit 400 outputs a coded pulse signal of about 116 KHz (mid-range frequency signal of more than 20 KHz); when the switch S2 is turned off, the control unit 400 outputs a coded pulse signal of about 154 KHz. The coupling filter circuit 200 composed of the resistance R4 and the capacitance C2 superimposes the coded pulse signal outputted by the control unit 400 to a main circuit and is feedback to the mobile phone connected with the earphone, the mobile phone distinguishes the operation of the switch S1 or the switch S2 according to the coded pulse signals, so as to implement the volume regulating or song move previous/move next operation of another operation system (such as IOS).

Figure 5:
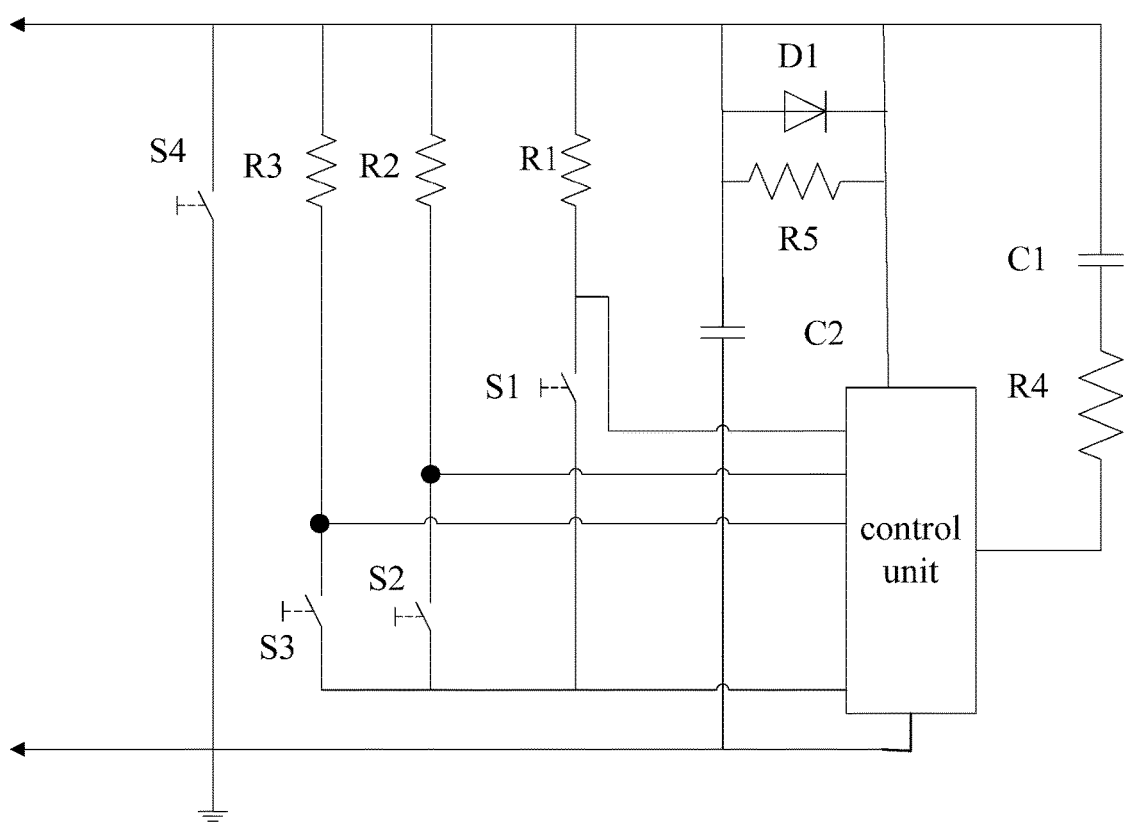
FIG. 5 is a block diagram of an earphone line control device in accordance with another embodiment.

FIG. 5 shows another embodiment of the disclosure, in the embodiment, the earphone line control device further includes a custom switch circuit composed of a switch S3 and a resistance R3, an end of the resistance R3 is connected to the power supply, the other end of the resistance R3 is in series with the switch S3 and connected to the control unit 400, connecting to an end of the control unit 400. When the switch S3 is turned on or turned off, the control unit 400 outputs a preset coded audio signal, the coded audio signal is a low frequency stage signal in the range of 20-20 KHz, the mobile phone connected to the earphone line control device decodes the coded audio signal, and implements different functions set by a user by running different applications programs(App), e.g. Wechat voice messages, playing wechat voice messages, taking photos, turning volume up/down, previous song/next song, screen scraping, and voice controlling.

Figure 6:
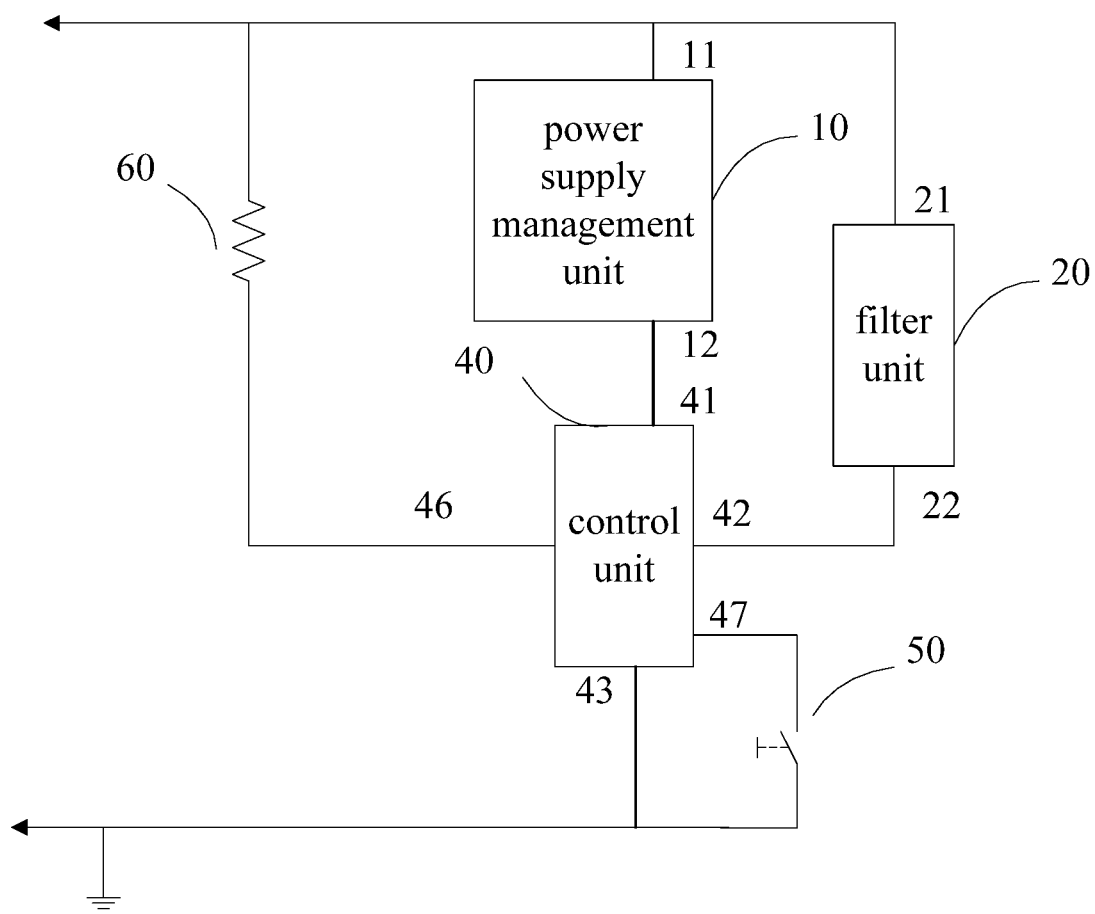
FIG. 6 is a block diagram of an earphone line control device in accordance with another embodiment.

FIG. 6 is a block diagram of another earphone line control device provided by the present disclosure. The earphone line control device includes a power supply management unit 10, a filter unit 20, a switching circuit including a switch 50 and a resistance 60, and a control unit 40. A first end 11 of the power supply management unit 10, an end 21 of the filter unit 20 and an end of the resistance 60 are respectively connected to a power supply, a second end 12 of the power supply management unit 10 is connected to a first end 41 of the control unit 40, the other end 22 of the filter unit is connected to a second end 42 of the control unit 40, a third end 13 of the power supply management unit 10 is connected to ground, a third end 43 of the control unit 40 is connected to ground, the other end of the resistance 60 is connected to a sixth end 46 of the control unit 40, an end of the switch 50 is connected to a seventh end 47 of the control unit 40, and the other end of the switch 50 is connected to ground.

When the switch 50 is turned on, the control unit 40 detects that the seventh end 47 is at low level, the control unit 40 set the sixth end 46 of the control unit 40 corresponding to the resistance 60 to low level, and the control unit 40 outputs nothing, the mobile phone connected with the earphone automatically identifies the voltage value of the upper end of the resistance 60, and the earphone function of the operation system A is implemented. When the switch 50 is turned off, the control unit 40 set the sixth end 46 corresponding to the resistance 60 to high level, the control unit 40 outputs a preset coded pulse signal, the mobile phone connected with the earphone receives the coded pulse signal, and then executes corresponding operation, such as the earphone function of the operation system B.

In another embodiment of the disclosure, the power supply management unit 10 includes a diode D1, a second resistance R5 and a power supply capacitance C2. An anode of the diode D1, an end of the second resistance R5, and an end of the power supply capacitance C2 are all connected to the power supply, a cathode of the diode D1 and the other end of the second resistance R5 are both connected to the first end 41 of the control unit 40, and the other end of the power supply capacitance C2 is connected to ground.

In another embodiment of the disclosure, the filter unit 20 consists of a resistance R4 connecting in series with a capacitance C1.

Figure 7:
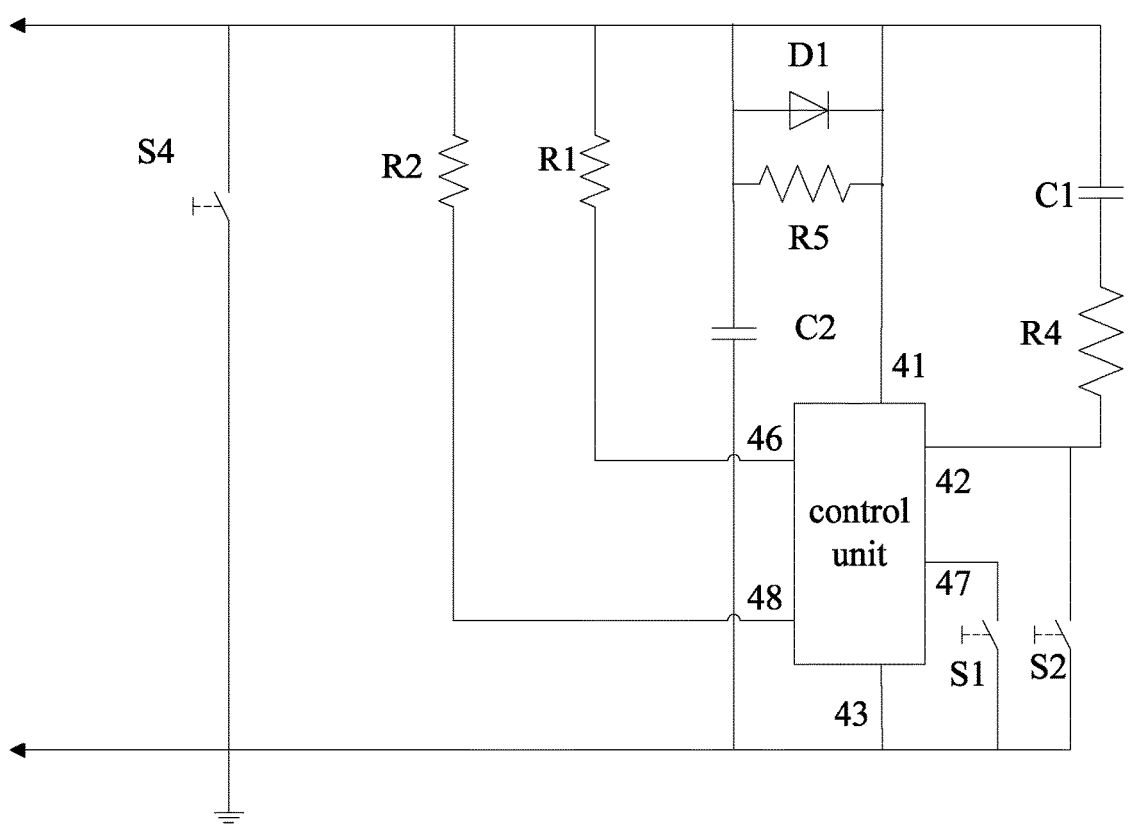
FIG. 7 is a block diagram of an earphone line control device in accordance with another embodiment.

FIG. 7 shows another embodiment of the disclosure, wherein the earphone line control device includes two switching circuit, one switching circuit includes a resistance R1 and a switch S1, and the other switching circuit includes a resistance R2 and a switch S2. The switch S1 is a VOL DOWN (−) switch of the earphone line control device, the switch S2 is a VOL UP (+) switch of the earphone line control device. A switch S4 is a PLAY/PAUSE switch, the control unit 40 detects whether the switch S1 or the switch S2 is turned off.

When the switch S1 or the switch S2 is turned on, the control unit 40 detects that the seventh end 47 corresponding to the switch S1 or the second end 42 corresponding to the switch S2 is at low level, and the sixth end 46 corresponding to the resistance R1 or the eighth end 48 corresponding to the resistance R2 is set to low level; at this moment, the resistance R1 or the resistance R2 divides voltage with an internal circuit of the mobile phone, and forms different voltage values, the mobile phone distinguishes whether the switch S1 or the switch S2 is turned on according to the voltage values, so as to implement functions of volume regulating or previous song/next song on an earphone of a kind of operation system (such as Android).

When the switch S1 or the switch S2 is turned off, the control unit 40 detects that the seventh end 47 corresponding to the switch S1 or the second end 42 corresponding to the switch S2 is at high level, and the sixth end 46 corresponding to the resistance R1 or the eighth end 48 corresponding to the resistance R2 is set to high level, the control unit 40 outputs a coded pulse signal via the second end 42.

When the switch S1 is turned off, the control unit 40 outputs a coded pulse signal of about 116 KHz (mid-range frequency signal of more than 20 KHz); when the switch S2 is turned off, the control unit 40 outputs a coded pulse signal of about 154 KHz. The coupling filter circuit 20 composed of the resistance R4 and the capacitance C2 superimposes the coded pulse signal outputted by the control unit 40 to a main circuit and is feedback to the mobile phone connected with the earphone, the mobile phone distinguishes the operation of the switch S1 or the switch S2 according to the coded pulse signals, so as to implement functions of volume regulating or previous song/next song on an earphone of another operation system (such as IOS).

Figure 8:
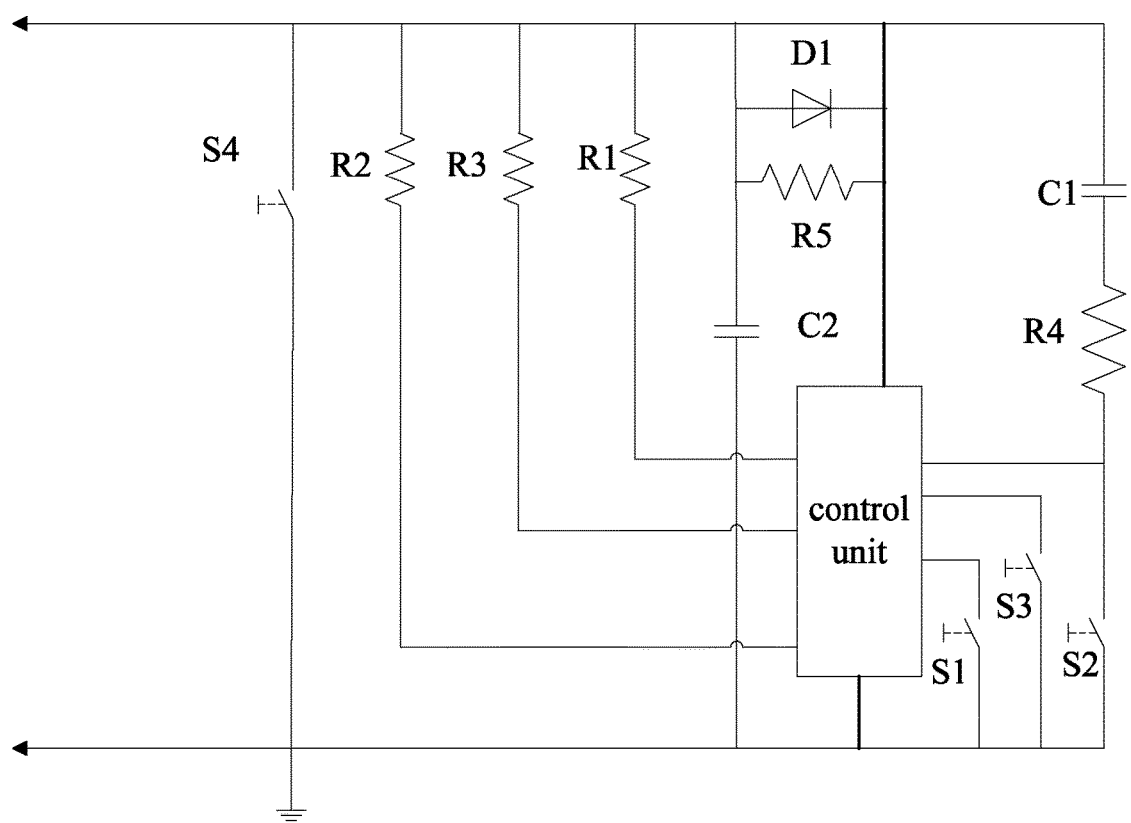
FIG. 8 is a block diagram of an earphone line control device in accordance with another embodiment.

FIG. 8 shows another embodiment of the disclosure, in the embodiment, the earphone line control device further includes a custom switch circuit composed of a switch S3 and a resistance R3. An end of the resistance R3 is connected to the power supply, the other end of the resistance R3 is connected in series with the control unit 40. An end of the switch S3 is connected to the control unit 40, the other end of the switch S3 is connected to ground. When the switch S3 is turned on or turned off, the control unit 40 outputs a preset coded audio signal, the coded audio signal is a low frequency stage signal in the range of 20-20 KHz, the mobile phone connected to the earphone line control device decodes the coded audio signal, and different functions set by a user are implemented by running different applications programs (App), e.g. Wechat voice messages, playing wechat voice messages, taking photos, turning volume up/down, previous song/next song, screen scraping, and voice controlling.

The embodiments described above only show a few implement manners of the present invention, the description is specific and detailed, but it cannot be interpreted as a limitation of the range of the present invention. What should be pointed out is that it is apparent to those skilled in the art that a variety of modifications and changes may be made without departing from the scope of the present invention. Thus, the range of the present invention should be defined by the appended claims.

What is claimed is:

1. An earphone line control device, comprising: a power supply management unit, a filter unit, a switching circuit and a control unit, wherein the switching circuit comprises a switch in series with a first resistance, a first end of the power supply management unit and an end of the filter unit are both connected to a power supply, a second end of the power supply management unit is connected to a first end of the control unit, the other end of the filter unit is connected to a second end of the control unit, a third end of the power supply management unit is connected to ground, a third end of the control unit is connected to ground, an end of the first resistance is connected to the power supply, the other end of the first resistance is in series with an end of the switch and connected to a fifth end of the control unit, and the other end of the switch is connected to a fourth end of the control unit; when the switch is turned off, the control unit outputs a preset coded pulse signal; wherein the power supply management unit comprises a diode, a second resistance and a power supply capacitance; an anode of the diode, an end of the second resistance, and an end of the power supply capacitance are all connected to the power supply, a cathode of the diode and the other end of the second resistance are both connected to the first end of the control unit, and the other end of the power supply capacitance is connected to ground.

2. The earphone line control device according to claim 1, wherein the line control device further comprises a custom switch circuit, when the switch in the custom switch circuit is turned off, the control unit outputs a preset coded audio signal wherein the preset coded audio signal is transmitted to a device connected to the earphone line control device and further wherein the preset coded audio signal is associated with a corresponding operation.

3. The earphone line control device according to claim 2, wherein when the switches in different switch circuits are turned off, the control unit respectively outputs different preset coded audio signals.

4. An earphone line control device, comprising: a power supply management unit, a filter unit, a switching circuit and a control unit, wherein the switching circuit comprises a switch and a first resistance, a first end of the power supply management unit and an end of the filter unit are both connected to a power supply, a second end of the power supply management unit is connected to a first end of the control unit, the other end of the filter unit is connected to a second end of the control unit, a third end of the power supply management unit is connected to ground, a third end of the control unit is connected to ground, an end of the first resistance is connected to the power supply, the other end of the first resistance is connected to a sixth end of the control unit, an end of the switch is connected to a seventh end of the control unit, and the other end of the switch is connected to ground; when the switch is turned off, the control unit outputs a preset coded pulse signal; wherein the power supply management unit comprises a diode, a second resistance and a power supply capacitance; an anode of the diode, an end of the second resistance and an end of the power supply capacitance are all connected to the power supply, a cathode of the diode and the other end of the second resistance are both connected to the first end of the control unit, and the other end of the capacitance is connected to ground.

5. The earphone line control device according to claim 4, wherein the line control device further comprises a custom switch circuit, when the switch in the custom switch circuit is turned off, the control unit outputs a preset coded audio signal wherein the preset coded audio signal is transmitted to a device connected to the earphone line control device and further wherein the preset coded audio signal is associated with a corresponding operation.

6. The earphone line control device according to claim 5, wherein when the switches in different switch circuits are turned off, the control unit respectively outputs different preset coded audio signals.

7. An earphone, comprising: an audible unit, an earphone line control device, a plug, and a cable receiving the audible unit and the plug, wherein the earphone line control device comprises: a power supply management unit, a filter unit, a custom switching circuit and a control unit; the switching circuit comprises a switch in series with a first resistance, a first end of the power supply management unit and an end of the filter unit are both connected to a power supply, a second end of the power supply management unit is connected to a first end of the control unit, the other end of the filter unit is connected to a second end of the control unit, a third end of the power supply management unit is connected to ground, a third end of the control unit is connected to ground, an end of the first resistance is connected to the power supply, the other end of the first resistance is in series with an end of the switch and connected to a fifth end of the control unit, and the other end of the switch is connected to a fourth end of the control unit; when the switch is turned off, the control unit outputs a preset coded pulse signal; wherein the power supply management unit comprises a diode, a second resistance and a power supply capacitance; an anode of the diode, an end of the second resistance and an end of the power supply capacitance are all connected to the power supply, a cathode of the diode and the other end of the second resistance are both connected to the first end of the control unit, and the other end of the capacitance is connected to ground.

8. The earphone according to claim 7, wherein the line control device further comprises a custom switch circuit, when the switch in the custom switch circuit is-turned off, the control unit outputs a preset coded audio signal wherein the preset coded audio signal is transmitted to a device connected to the earphone line control device and further wherein the preset coded audio signal is associated with a corresponding operation.

9. The earphone according to claim 8, wherein when the switches in the different switch circuits are turned off, the control unit respectively outputs different preset coded audio signals.

10. An earphone, an audible unit, an earphone line control device, a plug, and a cable receiving the audible unit and the plug, wherein the earphone line control device comprises: a power supply management unit, a filter unit, a switching circuit and a control unit; the switching circuit comprises a switch and a first resistance, a first end of the power supply management unit and an end of the filter unit are both connected to a power supply, a second end of the power supply management unit is connected to a first end of the control unit, the other end of the filter unit is connected to a second end of the control unit, a third end of the power supply management unit is connected to ground, a third end of the control unit is connected to ground, an end of the first resistance is connected to the power supply, the other end of the first resistance is connected to a sixth end of the control unit, an end of the switch is connected to a seventh end of the control unit, and the other end of the switch is connected to ground; when the switch is turned off, the control unit outputs a preset coded pulse signal; wherein the power supply management unit comprises a diode, a second resistance and a power supply capacitance; an anode of the diode, an end of the second resistance and an end of the power supply capacitance are all connected to the power supply, a cathode of the diode and the other end of the second resistance are both connected to the first end of the control unit, and the other end of the capacitance is connected to ground.

11. The earphone according to claim 10, wherein the line control device further comprises a custom switch circuit, when the switch in the custom switch circuit is turned off, the control unit outputs a preset coded audio signal wherein the preset coded audio signal is transmitted to a device connected to the earphone line control device and further wherein the preset coded audio signal is associated with a corresponding operation.

12. The earphone according to claim 11, wherein when the switches in the different switch circuits are turned off, the control unit respectively outputs different preset coded audio signals.

\* \* \* \* \*